United States Patent
Freidhoff et al.

(10) Patent No.: US 6,509,941 B2
(45) Date of Patent: Jan. 21, 2003

(54) LIGHT-PRODUCING DISPLAY HAVING HIGH APERTURE RATIO PIXELS

(75) Inventors: Henry R. Freidhoff, Rochester, NY (US); Giana M. Phelan, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 111 days.

(21) Appl. No.: 09/815,076

(22) Filed: Mar. 22, 2001

(65) Prior Publication Data

US 2002/0173215 A1 Nov. 21, 2002

(51) Int. Cl.[7] .................. G02F 1/133; G02F 1/13; G09G 5/00
(52) U.S. Cl. .................. 349/73; 349/187; 345/1.3; 345/903
(58) Field of Search .................. 349/73, 187; 345/1.1, 345/1.3, 903, 694; 156/304.1, 304.5

(56) References Cited

U.S. PATENT DOCUMENTS

| | | | |
|---|---|---|---|
| 5,179,459 A | * | 1/1993 | Plesinger .................. 349/122 |
| 5,781,258 A | | 7/1998 | Dabral et al. .................. 349/73 |
| 5,889,568 A | | 3/1999 | Seraphim et al. .................. 349/73 |
| 5,903,328 A | | 5/1999 | Greene et al. .................. 349/73 |
| 6,133,969 A | * | 10/2000 | Babuka et al. .................. 345/1.3 |
| 6,184,952 B1 | * | 2/2001 | Greene et al. .................. 345/88 |
| 6,259,497 B1 | * | 7/2001 | McDonnell et al. .................. 349/73 |

OTHER PUBLICATIONS

US 5,980,348, 11/1999, Gaynes et al. (withdrawn)

* cited by examiner

Primary Examiner—William L. Sikes
Assistant Examiner—Tarifur R Chowdhury
(74) Attorney, Agent, or Firm—Raymond L. Owens

(57) ABSTRACT

A method of making a tiled emissive display having at least two aligned tiles including finishing at least one edge of each tile and aligning the finished edges of such tiles and forming a monolithic structure including aligned tiles, each such aligned tile having a substrate, TFT circuits, drive circuits and bottom pixel electrodes for providing electrical signals to pixels in the corresponding tile. The method also includes coating the aligned tiles with material that produces light when activated by an electric field and forming at least one top pixel electrode over the coated material so that the coated material produces light when activated by an electric field from the electrode.

18 Claims, 7 Drawing Sheets

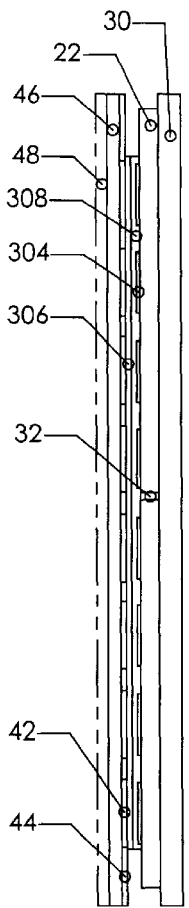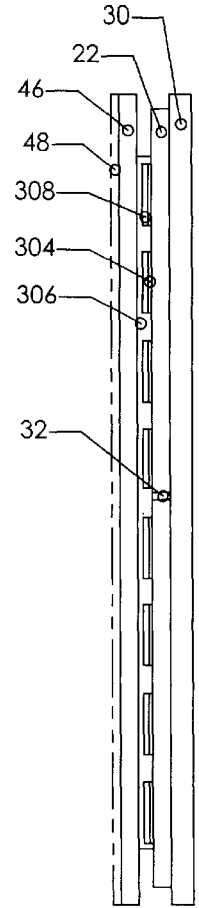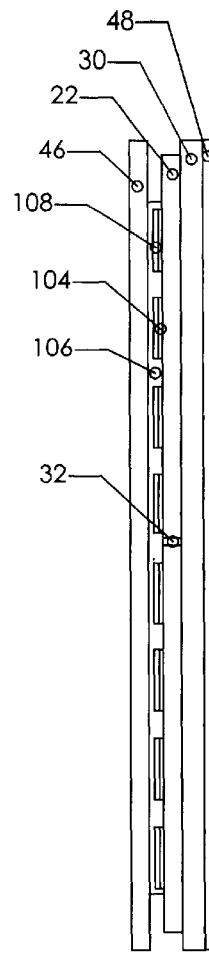
SECTION A-A
SECTION A-A
SECTION A-A
FIG. 3
FIG. 4
FIG. 5

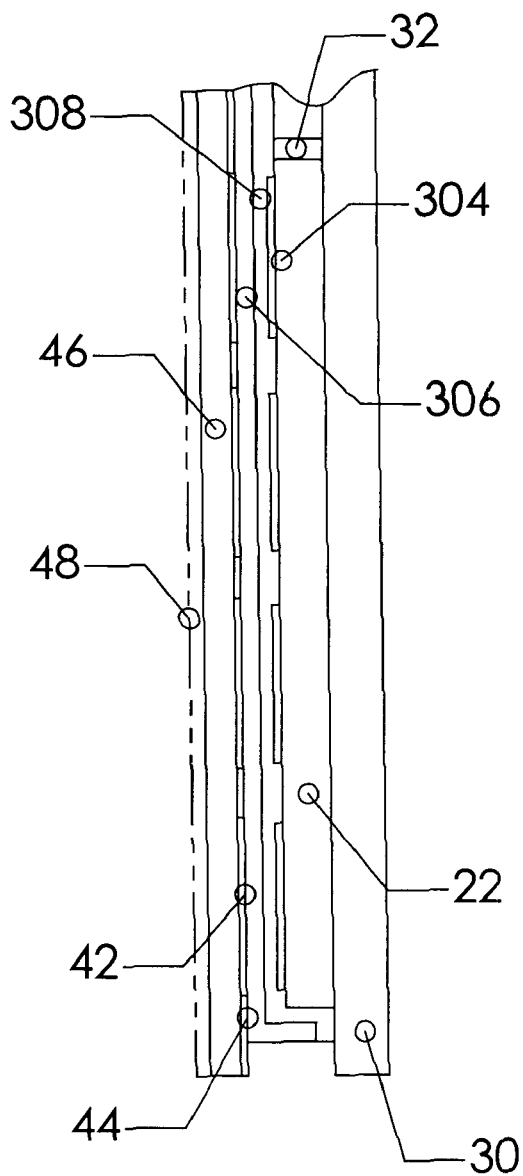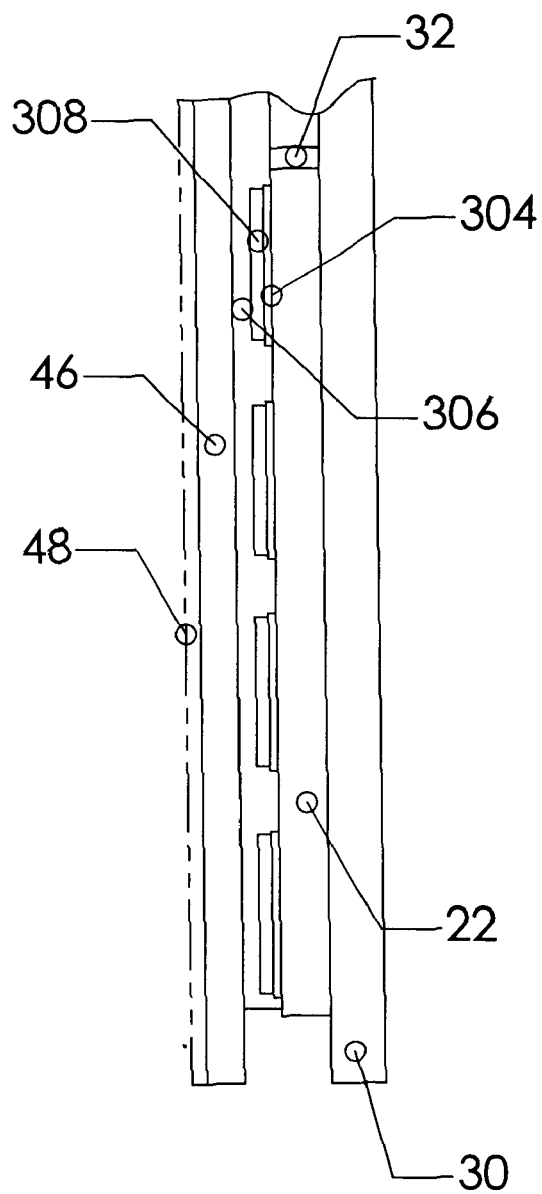
SECTION A-A                      SECTION A-A
FIG. 7                                   FIG. 8

LIGHT-PRODUCING DISPLAY HAVING HIGH APERTURE RATIO PIXELS

FIELD OF THE INVENTION

The present invention relates generally to tiled emissive displays, which include a plurality of tiles, which are aligned to produce an image.

BACKGROUND OF THE INVENTION

Flat panel technology has been dominated by liquid crystal displays (LCD's) in which the liquid crystal material acts as a valve to transmit light from a back light source. Large displays are usually smaller displays tiled together. For large LCD panels the tile building blocks are generally complete displays with the liquid crystal material in the cavity defined by two glass plates that are sealed around the perimeter. The edges of the sealed tiles are cut and polished to minimize the distance from the edge pixel to the edge of the tile. The integrity of the seal around the LCD material must be maintained thereby limiting the amount of cutting and polishing that is possible. Furthermore, variability in the performance from one tile to another can create discontinuities in the large panel image. The tiles are usually tested and sorted to minimize tile variability.

U.S. Pat. No. 5,980,348 describes a method for aligning and attaching LCD tiles for large panel displays. A mechanical alignment system is employed. U.S. Pat. No. 5,903,328 describes tiled LCD displays where the adjacent tile edges are ground at an angle and overlap each other. This allows a small increase in the space for the ground edge relative to the adjacent pixels; however, as the space increases the distance between the image planes of adjacent tiles increases proportionally. U.S. Pat. No. 5,889,568 describes a tiled LCD display wherein masking techniques are used to hide the seams between tiles. The mask can be positioned behind of the LCD tile to block stray light from the back light as well as in front of the tile. U.S. Pat. No. 5,781,258 describes an LCD tiled display wherein the half tiles are used and the final filling of the LCD material is completed within the cavity of all the tiles simultaneously.

Emissive displays, which produce their own light, have a very different structure from LCDs. The emissive material is deposited on to the substrate surface. A back plate or thin film coating provides protection from the environment. The organic and polymeric materials that produce light are sensitive to environment, heat and dirt. The preparation of the edges of emissive tiles is difficult due to the potential exposure to contaminants.

SUMMARY OF THE INVENTION

It is an object of the present invention to provide a large flat panel tiled emissive display with continuity of the pixels, both in light-emitting characteristics and in spacing, across the display area.

This object is achieved by a method of making a tiled emissive display having at least two aligned tiles, comprising the steps of:

a) finishing at least one edge of each tile and aligning the finished edges of such tiles;

b) forming a monolithic structure including aligned tiles, each such aligned tile having a substrate, TFT circuits, drive circuits and bottom pixel electrodes for providing electrical signals to pixels in the corresponding tile;

c) coating the aligned tiles with material that produces light when activated by an electric field; and d) forming at least one top pixel electrode over the coated material so that the coated material produces light when activated by an electric field from the electrode.

ADVANTAGES

It is an advantage of the present invention that individual tiles can be prepared, aligned and joined together prior to the deposition of light emitting materials. The aligned tiles are processed as a monolithic structure. By coating the joined tiles as a single flat panel, the process of polishing, squaring and aligning the edges of the tiles is complete prior to deposition. The preparation of the edges of the tiles produces many particles and is serious source of contamination; in the present invention, the debris from these operations can be removed prior to deposition of organic materials. The monolithic structure can be cleaned and the light-emitting materials are then deposited in a clean environment without further need to prepare the edges or handle the tiles for alignment.

It is a further advantage of the present invention that all the tiles in a single display are coated concurrently. Typically, for tiling of active matrix LCD displays, the tiles are sorted and characterized and then tiled together. However, any variations are readily evident at the seams. By coating all the tiles concurrently, the variations from different process runs and material lots are eliminated. Therefore, the tile-to-tile characteristics are indistinguishable across the seam.

It is a further advantage of the present invention that by coating the tiles as a monolithic structure the coating can be continuous across tiles thereby reducing coating edge effects within the tiled array. By eliminating the edge effects, active pixels can be placed along the edge of the tiles to allow for pixel pitch integrity from tile to tile.

It is a further advantage of the present invention that the coated monolithic structure can be immediately packaged and encapsulated in its entirety. The monolithic structure is therefore more readily protected from the environment. Individual tiles do not need to be handled after deposition of the sensitive light emitting materials; elimination of this handling time greatly reduces risk of environmental degradation and increases yield and reliability of the display.

It is a further advantage of the present invention that higher temperature joining techniques can be used to bond tiles to make the monolithic structure. By bonding the tiles prior to deposition of the light emitting materials high temperature processes including metal bonding, high temperature adhesive, microwave bonding, and fusion joining can be used. In addition, ultraviolet light activated adhesives can be used prior to deposition of light emitting material.

It is a further advantage of the present invention that electrical interconnections to the monolithic structure can be established prior to coating deposition. Connection techniques that require high temperature, ultrasonics or pressure can be used only when the light emitting materials are not present. By positioning the tiles prior to deposition of the light emitting material, electrical connections can be made to a back plate by means including soldering, ultrasonic bonding, microwave bonding, and conductive adhesives. Furthermore, electrical escapes including attachment of flex connections at high temperatures including soldering, can be established. Cleaning of the monolithic structure after electrical connections are made and prior to deposition of the light emitting materials facilitates high quality displays.

It is a further advantage of the present invention that it is suitable for use in organic electroluminescent displays. A feature of the invention is that it can be readily manufactured and the display will not produce artifacts caused by aligned tiles.

It is advantageous to prepare the tile edges and align the tiles prior to deposition of the light emitting materials.

BRIEF DESCRIPTION OF THE DRAWINGS

FIG. 3 is a cross section of the monolithic structure shown in FIG. 1. with top emitting pixels and color filters coated on a top plate;

FIG. 4 is a cross section of the monolithic structure shown in FIG. 1. with pattern coated top emitting pixels of different color;

FIG. 5 is a cross section of the monolithic structure shown in FIG. 1. with pattern coated bottom-emitting pixels of different colors;

FIG. 7 is a cross section of the monolithic structure shown in FIG. 6 with top emitting pixels and color filters coated on a top plate;

FIG. 8 is a cross section of the monolithic structure shown in FIG. 6 with pattern coated top emitting pixels of different colors;

DETAILED DESCRIPTION OF THE PREFERRED EMBODIMENTS

Figure 1:
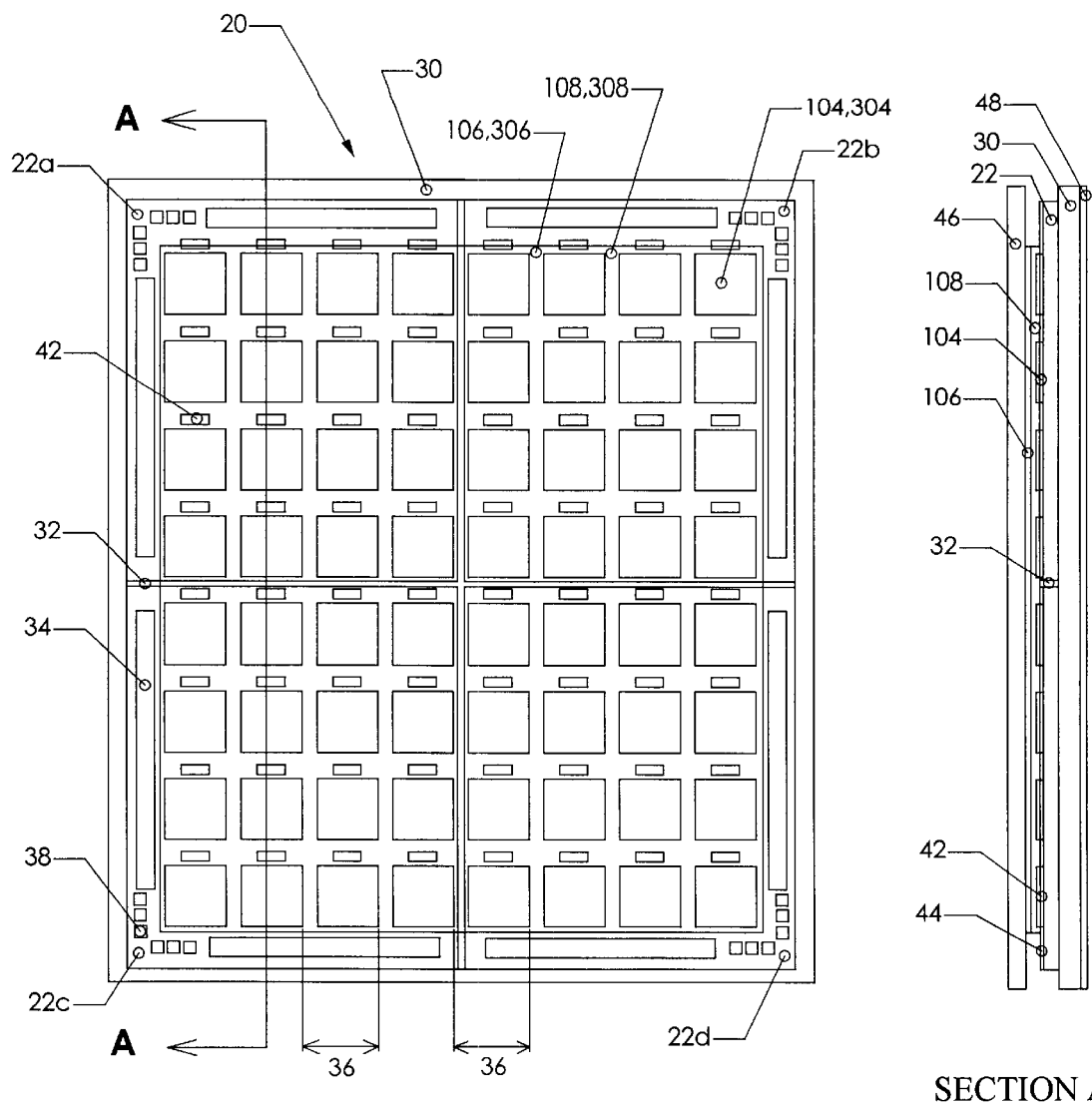
FIG. 1 is a composite of a monolithic structure with drive circuits on the edges outside the display area.

Turning now to FIGS. 1–5, a composite view of a monolithic structure 20 is shown for an emissive display. The monolithic structure 20 is composed of tiles 22a–d that are preprocessed for edge quality. The tiles 22 have thin film transistor (TFT) circuits 40 and bottom pixel electrode 104 or 304 arrays defining the active area of the display. The drive electronics 34 and TFT 40 circuits provide electrical signals to pixels 100 in the corresponding tile. It is understood that the tiles 22 can be tested to ensure proper performance of the TFT circuits 40 and drive circuits 34. The edges of the tiles 22 are polished to maintain a parallel line to the bottom pixel electrode 104 or 304 array. Furthermore, the polishing reduces the distance from the outermost pixel to the tile 22 edge. The tiles 22 are aligned with a position so that the pixel pitch 36 across the seam of the adjacent tiles is approximately equal to the pixel pitch 36 within the array of a single tile. The tiles 22 can be affixed to each other using adhesive. Furthermore, higher temperature joining techniques can be used to bond tiles to make the monolithic structure 20. Light emitting materials are sensitive to temperature and ultraviolet light; this severely limits the options for bonding tiles together. By bonding the tiles prior to deposition of the light emitting materials 108 or 308 high temperature processes including metal bonding, high temperature adhesive, microwave bonding, and fusion joining can be used. In addition, ultraviolet adhesives can be used prior to deposition of light emitting material 108 or 308. The proximity of the pixel area to the space 32 between tiles precludes the ability to mask only the pixel area; therefore, it would not be possible to use ultraviolet processes after deposition. Prior to deposition of the light emitting material 108 or 308 the monolithic structure 20 can be thoroughly cleaned.

Light emitting material 108 or 308 is deposited onto the monolithic structure 20. It is understood that the light emitting material 108 or 308 can be several materials that when layered or combined provide the desired light emitting properties when activated by an electric field. In addition, it is understood that the monolithic structure 20 can be supported by a carrier throughout processing. The material can be deposited in numerous ways including, but not limited to, evaporation, sublimation, and spin coating. The coatings 108 or 308 can be continuous across the monolithic structure 20, extending beyond the edge of the tiles 22 and covering the space 32 between tiles 22. When the coating is continuous the light emitting material 108 or 308 is monochromatic, with the preferred embodiment being white light emitting. The coatings 108 or 308 include an electroluminescent material that produces light when activated by an electric field. The top pixel electrode 106 or 306 is subsequently deposited over the light emitting materials in the coatings 108 or 308. The top pixel electrodes 106 or 306 require a low work function conductive material.

Figure 2:
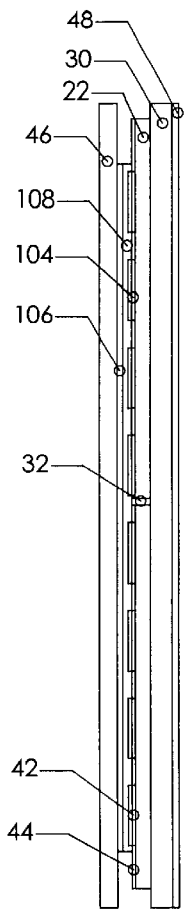
FIG. 2 is a cross section of the monolithic structure shown in FIG. 1. with bottom emitting pixels and color filters under the pixel.

When pixels 100 are bottom emitting as shown in FIG. 2 color filters 42 and a passivation layer 44 can be formed on the tiles 22 prior to depositing the light transmissive bottom pixel electrode 104. The color filters 42 are aligned with bottom-emitting pixels 100 and can be patterned to provide a full color display; one color combination being red, green and blue.

In another embodiment where the multilayer organic top emitting pixels 300 are top emitting and have a light transmissive top pixel electrode 306a and b he color filters 42, which are aligned to the multilayer organic top emitting pixels 300, and the passivation layer 44 can be formed on a top plate 46 that serves as the viewing plane for the display. The color filters 42 can be patterned to provide a full color display; one color combination being red, green and blue.

In another embodiment where pixels 100 are bottom emitting as shown in FIG. 5, the light emitting material 108 is pattern deposited on the bottom pixel electrodes, 104 and viewed through the bottom. The deposition can be accomplished by evaporation, sublimation, or other means. Additionally, different pixels 100 can emit different colored light including patterned color combinations that produce a full-color display. Alternatively, if the multilayer organic top emitting pixels 300 are top emitting as shown in FIG. 4 the light emitting material 308 is pattern deposited on the bottom pixel electrode 304 and viewed through the top pixel electrode 306.

Figure 6:
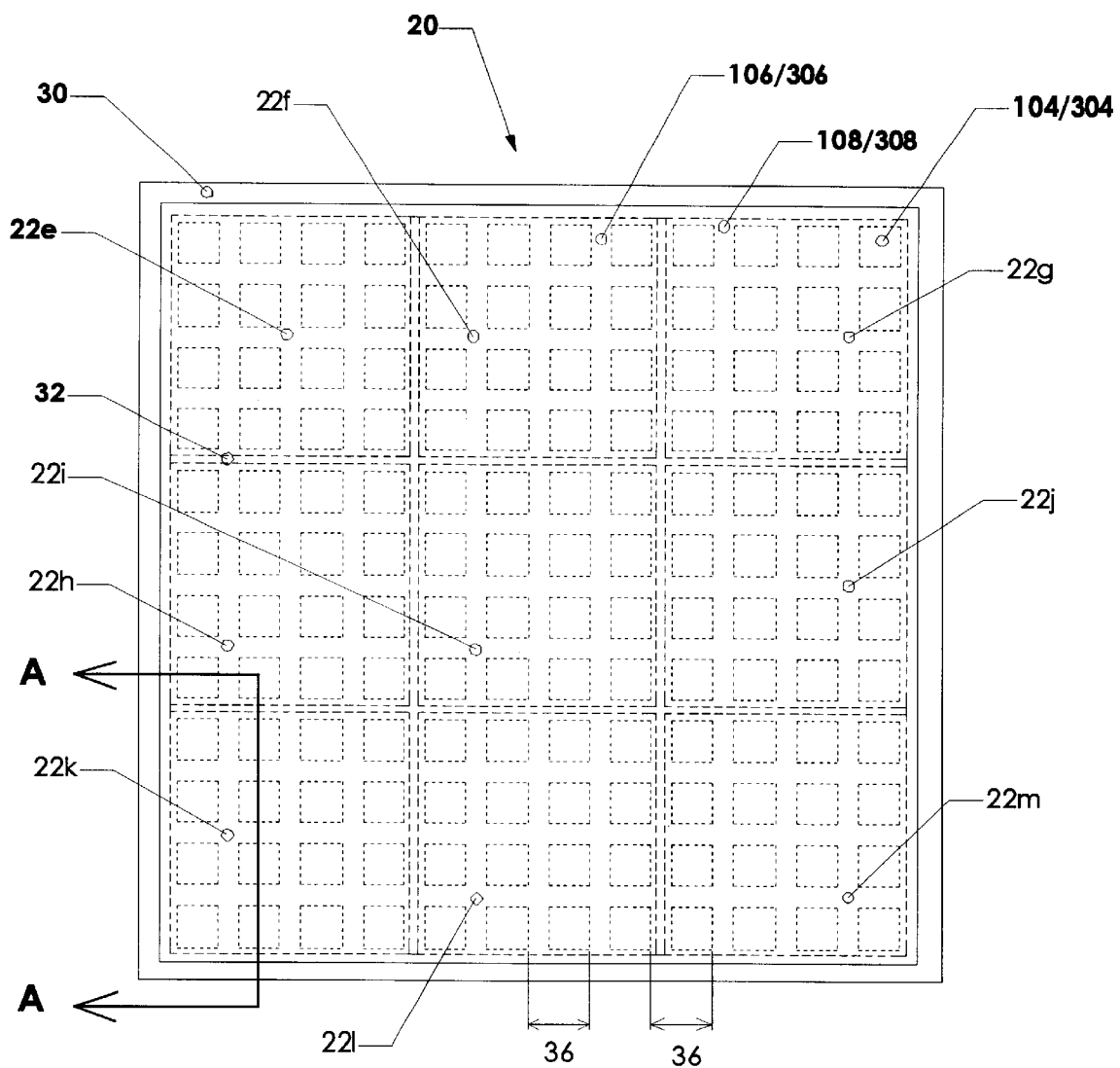
FIG. 6 is a composite of a monolithic structure including an island tile with TFT circuits and driver circuits under the display pixels.

In the preferred embodiment as shown in FIGS. 6–8, the monolithic structure 20 can include island tiles 22i. Island tiles 22i are those tiles that do not have any drive circuits 34 at the perimeter of the monolithic structure 20. All of the tiles 22 are mounted on a back plate 30 to form a monolithic structure 20, which can then be coated. The island tiles 22i can have vertical electrical connections to conductors on the back plate 30. Additionally, it is understood that the TFT circuits 40 and the drive circuits 34 can be moved under the bottom pixel electrodes 104 or 304 in order to allow pixels along all four edges of the island tile 22i as disclosed in commonly assigned U.S. patent application Ser. No. 09/788,923 filed Feb. 20, 2001, entitled "Light-Producing High Aperture Display Having Aligned Tiles" by Henry R. Freidhoff et al., the disclosure of which is incorporated herein by reference.

In a further embodiment the tiles 22 are properly aligned and then affixed to back plate 30. The back plate 30 becomes a permanent part of the monolithic structure 20 and provides support when operated as a final display. The space 32 between the tiles can be, but need not be, filled by adhesive or other means. Desiccant or an oxygen gettering material can also be placed in the space 32. The tiles 22 are affixed to the back plate 30 by adhesive, metal bonding, or other means. Furthermore, the back plate 30 can be used to escape signal lines from the tiles 22. Electrical connections can be made from the tiles 22 of the monolithic structure 20 to the back plate 30. These connections can be made with conductive adhesive, flex, solder or other means. The connections can be made to vertical connections or run down the edges of the tile 22.

Figures 9, 11:
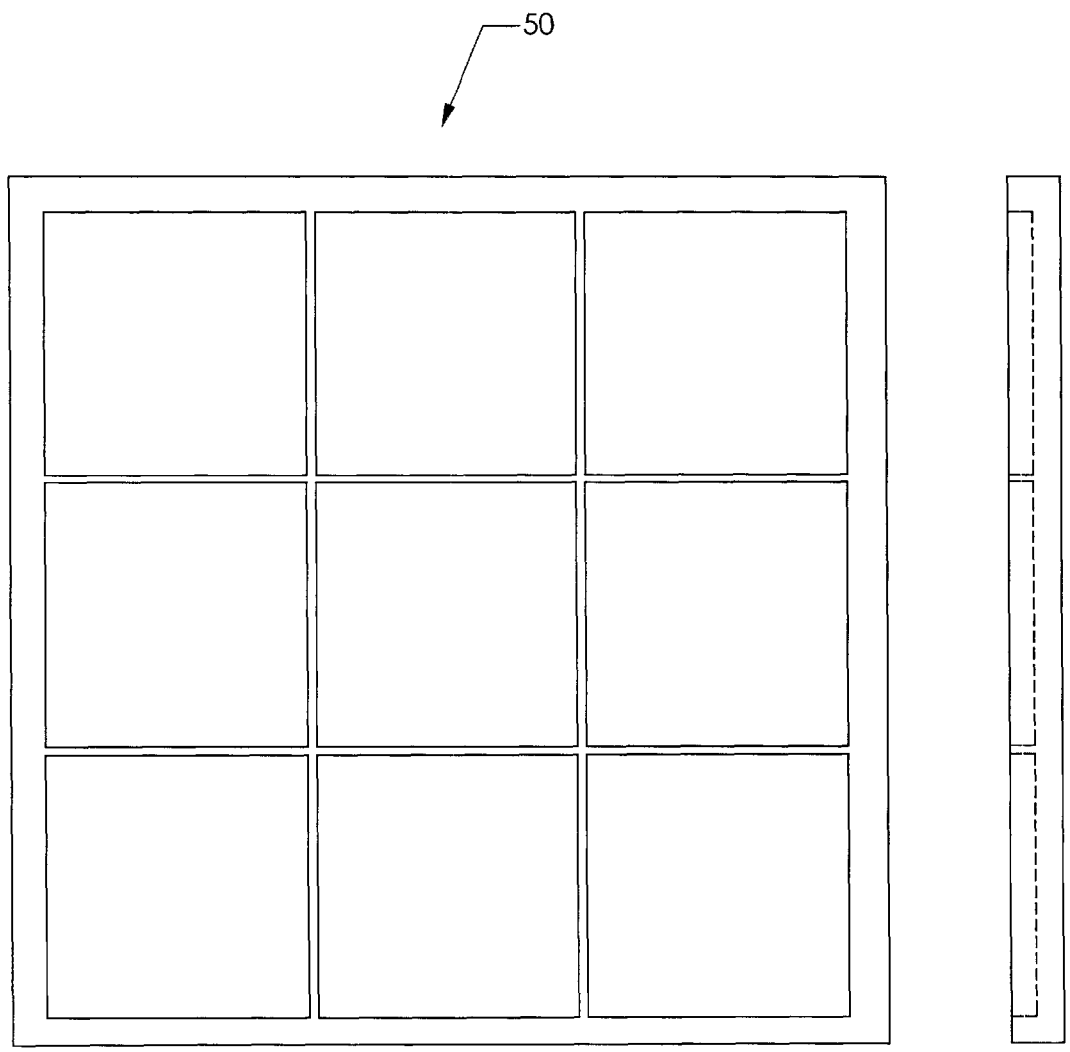
FIG. 9 is a top view of a temporary coating support fixture.
FIG. 11 is a side view of the coating support fixture shown in FIG. 9.
Figure 10:
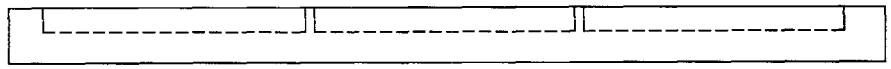
FIG. 10 is a front view of the coating support fixture shown in FIG. 9.

In another embodiment, a temporary support fixture 50, as shown in FIGS. 9–11, is used to temporarily secure tiles 22 for coating as a monolithic structure 20 wherein the temporary support fixture 50 is not a permanent support plate. In addition to providing support during concurrent tile 22 coating, the temporary support fixture 50 provides protection of the polished edges of the tiles 22. The tiles 22 are later removed from the temporary support fixture 50 and realigned and mounted in the final assembly. The alignment and the spacing of the tiles 22 in the temporary support fixture 50 are not critical during coating of the light emitting layer 108 or 308 and top pixel electrode 106 or 306. The coatings 108 or 308 and 106 or 306 can extend beyond the edge of the tiles to provide uniform coverage across all tiles.

As shown in FIGS. 2, 3, 4, 5, 7 and 8 a polarization layer 48 can be added to the viewing surface either the top plate 46 or back plate 30 to increase the contrast ratio of the display.

Figure 12:
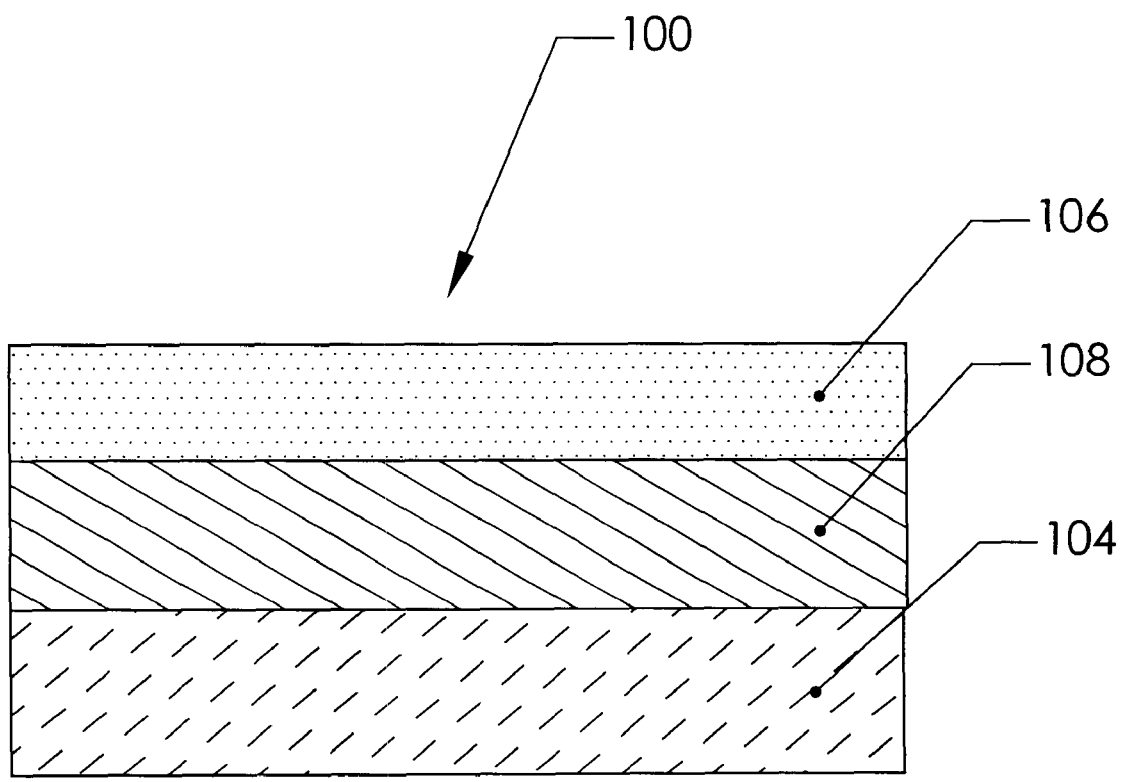
FIG. 12 is a cross section of a simple emissive pixel structure.
Figure 13:
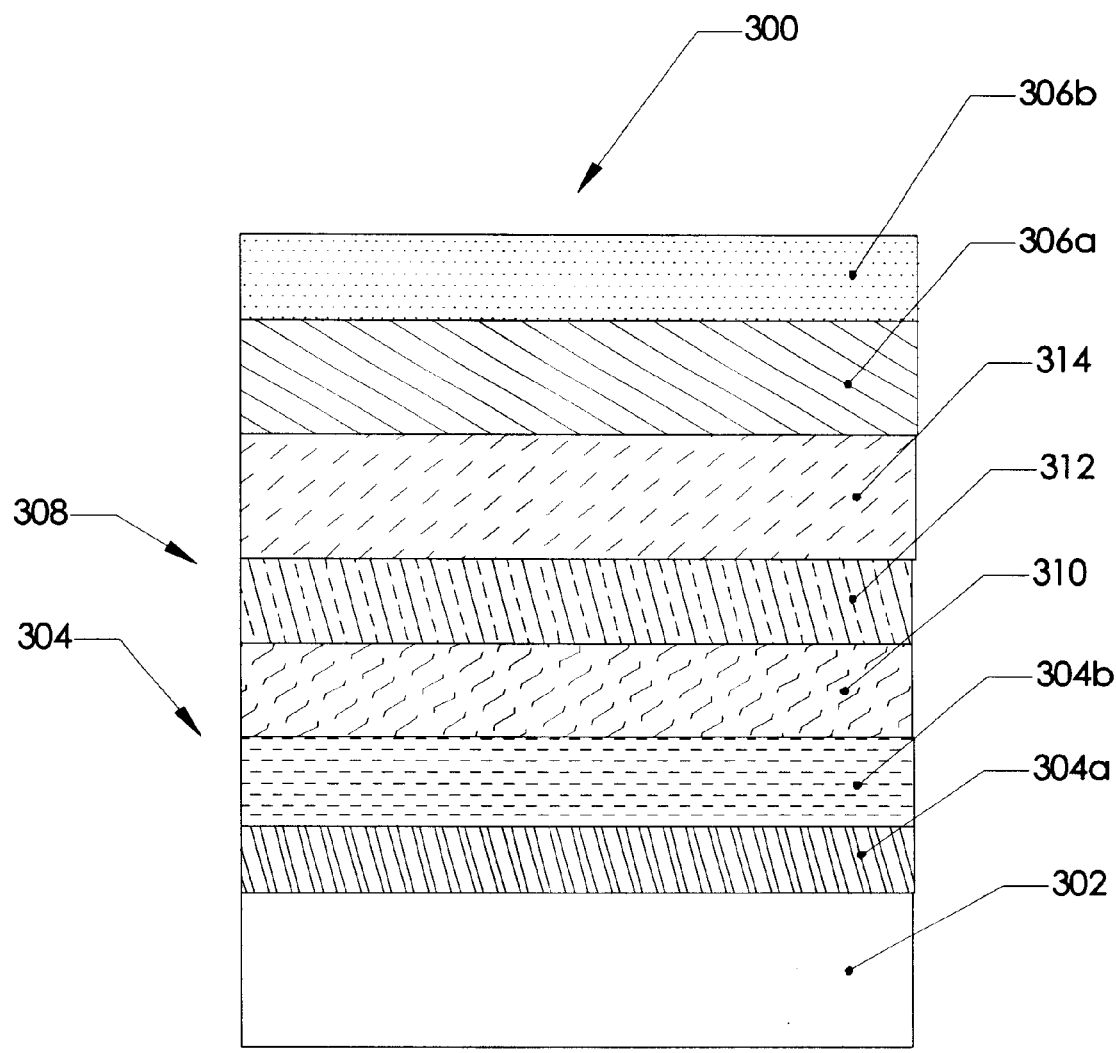
FIG. 13 is a cross section of a top emitting pixel structure.

The present invention is applicable to emissive displays, and is particularly suitable for, but not limited to, use in organic electroluminescent, EL, displays. FIGS. 12 and 13 show examples of pixels 100 and 300 with organic EL materials.

A light-emitting layer of an organic EL tile comprises a luminescent or fluorescent material where electroluminescence is produced as a result of electron-hole pair recombination in this region. In the simplest construction of a light-emitting pixel 100, as shown in FIG. 12, the light-emitting layer 108 is sandwiched between the bottom pixel electrode or 104 and top pixel electrode 106. The light-emitting layer is a pure material with a high luminescent efficiency. A well-known material is tris (8-quinolinato) aluminum, (Alq), which produces excellent green electroluminescence.

The simple structure 100 can be modified to a three-layer structure in which an additional EL layer is introduced between the hole and electron-transporting layers to function primarily as the site for hole-electron recombination and thus electroluminescence. In this respect, the functions of the individual organic layers are distinct and can therefore be optimized independently. Thus, the electroluminescent or recombination layer can be chosen to have a desirable EL color as well as high luminance efficiency. Likewise, the electron and hole transport layers can be optimized primarily for the carrier transport property.

In a preferred embodiment when the top plate 46 is the viewing surface, the multilayer organic top emitting pixel 300, as shown in FIG. 13, emits light from the top and has a substrate 302 on which is disposed a light reflective conductive bottom pixel layer 304. The bottom pixel electrode 304 comprises two layers 304a and 304b. 304a is a light reflective conductive metal layer and 304b is a thin light transmissive layer of a conductive high work function material. An organic light-emitting structure 308 is formed between a top pixel electrode 306 and a bottom pixel electrode 304. The top pixel electrode 306 is composed of two layers 306a and 306b. 306a is a thin light transmissive conductive layer of a low work function material and 306b is a light transmissive conductive layer such as indium tin oxide. The organic light-emitting structure 308 is comprised of, in sequence, an organic hole-transporting layer 310, an organic light-emitting layer 312, and an organic electron-transporting layer 314. When an electrical potential difference (not shown) is applied between the bottom pixel electrode 304 and the top pixel electrode 306, the top pixel electrode 306 will inject electrons into the electron-transporting layer 314, and the electrons will migrate across layer 314 to the light-emitting layer 312. At the same time, holes will be injected from the bottom pixel electrode 304 into the hole-transporting layer 310. The holes will migrate across layer 310 and recombine with electrons at or near a junction formed between the hole-transporting layer 310 and the light-emitting layer 312. When a migrating electron drops from its conduction band to a valence band in filling a hole, energy is released as light, and is emitted through the light-transmissive top pixel electrode 306.

The invention has been described in detail with particular reference to certain preferred embodiments thereof, but it will be understood that variations and modifications can be effected with the spirit and scope of the invention.

PARTS LIST 20 monolithic structure
22 tile
22 a–d tiles with drive circuits at the edges beyond the pixels
22e–m tiles with circuits and drive circuits under the pixels
30 back plate
32 gap between adjacent tiles
34 drive circuit
36 pixel pitch
38 signal connection
40 TFT circuit
42 color filter
44 passivation layer
46 top plate
48 polarization layer
50 temporary support fixture
100 pixel
104 bottom pixel electrode
106 top pixel electrode
108 light-emitting layer
300 multilayer organic top emitting pixel
302 substrate
304 bottom pixel electrode
304a light reflective conductive metal layer
304b high work function conductive material
306 top pixel electrode
306a low work function conductive material
306b light transmissive conductive layer
308 organic light-emitting structure 310 organic hole-transporting layer
312 organic light-emitting layer
314 organic electron-transporting layer

What is claimed is:

1. A method of making a tiled emissive display having at least two aligned tiles, comprising the steps of:
   a) finishing at least one edge of each tile and aligning the finished edges of such tiles;
   b) forming a monolithic structure including aligned tiles, each such aligned tile having a substrate, TFT circuits, drive circuits and bottom pixel electrodes for providing electrical signals to pixels in the corresponding tile;
   c) coating the aligned tiles with material that produces light when activated by an electric field; and
   d) forming at least one top pixel electrode over the coated material so that the coated material produces light when activated by an electric field from the electrode.

2. The method of claim 1 wherein the pitch between columns of pixels on all tiles is substantially the same and the pitch between rows of pixels on all tiles is substantially the same and the spaces between rows and columns of pixels on adjacent tiles are substantially the same as the spaces within a tile.

3. The method of claim 1 wherein the light emitting material is a monochromatic continuous coating and color filters are disposed under the pixels.

4. The method of claim 1 wherein the light emitting material is a monochromatic continuous coating and a top plate pattern coated with color filters its aligned with the pixels and attached to the tiles.

5. The method of claim 1 wherein the light emitting material is coated as discrete color emitting pixels arranged in a pattern to provide full color display.

6. The method of claim 1 wherein a top plate and back plate are attached to the display.

7. A tiled emissive display made in accordance with the method of claim 1.

8. A method of making a tiled emissive display having at least two aligned tiles, comprising the steps of:
   a) finishing at least one edge of each tile and aligning the finished edges of such tiles;
   b) forming a monolithic structure including aligned tiles, each such aligned tile having a substrate, TFT circuits, drive circuits and bottom pixel electrodes for providing electrical signals to pixels in the corresponding tile and mounting the tiles on a back plate;
   c) coating the aligned tiles with material that produces light when activated by an electric field; and
   d) forming at least one top pixel electrode over the coated material so that the coated material produces light when activated by an electric field from the electrode.

9. The method of claim 8 wherein the pitch between columns of pixels on all tiles is substantially the same and the pitch between rows of pixels on all tiles is substantially the same and the spaces between rows and columns of pixels on adjacent tiles are substantially the same as the spaces within a tile.

10. The method of claim 8 wherein the light emitting material is a monochromatic continuous coating and color filters are disposed under the pixels.

11. The method of claim 8 wherein the light emitting material is a monochromatic continuous coating and a top plate pattern coated with color filters is aligned with the pixels and attached to the tiles.

12. The method of claim 8 wherein the light emitting material is deposited as discrete color emitting pixels arranged in a pattern to provide full color display.

13. The method of claim 8 wherein a top plate is attached to the display.

14. A method of making a tiled emissive display having at least two aligned tiles, comprising the steps of:
   a) finishing at least one edge of each tile and aligning the finished edges of the tiles;
   b) forming a monolithic structure of the aligned tiles wherein each tile has a substrate, TFT circuits, drive circuits and bottom pixel electrodes for providing electrical signals to pixels being mounted to a temporary support fixture;
   c) coating the aligned tiles with material that produces light when activated by an electric field;
   d) coating at least one top pixel electrode over the coated material that produces light when activated by an electric field;
   e) removing the coated tiles from the temporary support fixture; and
   f) aligning and attaching the tiles to a permanent support back plate.

15. The method of claim 14 wherein the pitch between columns of pixels on all tiles is substantially the same and the pitch between rows of pixels on all tiles is substantially the same and the spaces between rows and columns of pixels on adjacent tiles are substantially the same as the spaces within a tile.

16. The method of claim 14 wherein the light emitting material is a monochromatic continuous coating and color filters are disposed under the pixels.

17. The method of claim 14 wherein the light emitting material is a monochromatic continuous coating and a top plate pattern coated with color filters is aligned with the pixels and attached to the tiles.

18. The method of claim 14 wherein the light emitting material is a monochromatic continuous coating and a top plate pattern coated with color filters is aligned with the pixels and attached to the tiles.

* * * * *